(12) United States Patent
Lender, Jr. et al.

(10) Patent No.: US 8,576,009 B2
(45) Date of Patent: Nov. 5, 2013

(54) BROADBAND HIGH POWER AMPLIFIER

(75) Inventors: Robert J. Lender, Jr., Pepperell, MA (US); Robert Actis, Burlington, MA (US)

(73) Assignee: Schilmass Co. L.L.C., Wilmington, DE (US)

( * ) Notice: Subject to any disclaimer, the term of this patent is extended or adjusted under 35 U.S.C. 154(b) by 19 days.

(21) Appl. No.: 13/316,900

(22) Filed: Dec. 12, 2011

(65) Prior Publication Data

US 2012/0081182 A1   Apr. 5, 2012

Related U.S. Application Data

(63) Continuation of application No. 13/081,279, filed on Apr. 6, 2011, now Pat. No. 8,076,975, and a continuation-in-part of application No. 13/016,599, filed on Jan. 28, 2011, application No. 13/316,900, which is a continuation-in-part of application No. 11/629,025, filed as application No. PCT/US2005/039407 on Nov. 1, 2005, now Pat. No. 7,924,097.

(60) Provisional application No. 61/299,072, filed on Jan. 28, 2010, provisional application No. 60/630,343, filed on Nov. 23, 2004.

(51) Int. Cl.
*H03F 3/60* (2006.01)

(52) U.S. Cl.
USPC ............................................. 330/286; 330/54

(58) Field of Classification Search
USPC ................. 330/286, 54, 295, 124 R
See application file for complete search history.

(56) References Cited

U.S. PATENT DOCUMENTS

| 2,930,986 | A | * | 3/1960 | Kobbe et al. ................ 330/54 |
| 2,957,143 | A | * | 10/1960 | Enloe ...................... 330/306 |
| 3,129,387 | A | * | 4/1964 | Sosin ........................ 330/54 |
| 4,446,445 | A | * | 5/1984 | Apel ........................ 330/269 |
| 4,486,719 | A | | 12/1984 | Ayasli |
| 4,540,954 | A | * | 9/1985 | Apel ........................ 330/286 |
| 4,543,535 | A | | 9/1985 | Ayasli |
| 4,733,195 | A | | 3/1988 | Tserng et al. |
| 4,754,234 | A | | 6/1988 | Gamand |

(Continued)

OTHER PUBLICATIONS

International Search Report, dated Aug. 10, 2006, received in International Patent Application No. PCT/US05/39407, 4 pgs.

(Continued)

*Primary Examiner* — Henry Choe
(74) *Attorney, Agent, or Firm* — McAndrews, Held & Malloy, Ltd.

(57) ABSTRACT

A broadband high power amplifier architecture is disclosed. One example configuration includes a first plurality of distributed amplification cells connected in a first string, wherein a conductive trace operatively coupling outputs of the first string cells is a stepped structure, such that the associated inductance successively decreases from a first cell to a last cell of the first string. The amplifier further includes a second plurality of distributed amplification cells connected in a second string, wherein a conductive trace operatively coupling outputs of the second string cells is a stepped structure, such that the associated inductance successively decreases from a first cell to a last cell of the second string. A combiner combines output signals of the first and second strings. Additional strings and/or stages can be provided, and the degree of combining will depend, for example, on factors such as the application and desired output power.

20 Claims, 13 Drawing Sheets

(56) References Cited

U.S. PATENT DOCUMENTS

| | | |
|---|---|---|
| 4,788,511 A | 11/1988 | Schindler |
| 5,021,743 A | 6/1991 | Chu et al. |
| 5,028,879 A | 7/1991 | Kim |
| 5,046,155 A | 9/1991 | Beyer et al. |
| 5,168,242 A | 12/1992 | Willems et al. |
| 5,177,381 A | 1/1993 | Friesen et al. |
| 5,355,422 A * | 10/1994 | Sullivan et al. .................. 385/1 |
| 5,361,038 A | 11/1994 | Allen et al. |
| 5,414,387 A | 5/1995 | Nakahara et al. |
| 5,485,118 A | 1/1996 | Chick |
| 5,801,591 A | 9/1998 | Parrott |
| 5,986,518 A | 11/1999 | Dougherty |
| 6,215,360 B1 | 4/2001 | Callaway |
| 6,252,461 B1 | 6/2001 | Raab |
| 6,538,509 B2 | 3/2003 | Ren |
| 6,552,634 B1 | 4/2003 | Raab |
| 6,674,329 B1 | 1/2004 | Stengel et al. |
| 6,791,417 B2 | 9/2004 | Pengelly et al. |
| 7,224,229 B2 * | 5/2007 | Belot ........................... 330/286 |
| 7,688,135 B2 | 3/2010 | Kim et al. |
| 2003/0231061 A1 | 12/2003 | Lautzenhiser et al. |
| 2008/0090539 A1 | 4/2008 | Thompson |

OTHER PUBLICATIONS

International Report on Patentability with Written Opinion of the International Searching Authority, received in International Patent Application No. PCT/US05/39404, 7 pgs.
Notice of Allowance dated Dec. 9, 2010 in U.S. Patent Publication No. US 2009-0309659, 6 pgs.
Office Action Response filed Nov. 18, 2010 in U.S. Patent Publication No. US 2009-0309659, 8 pgs.
Notice of Allowance dated Oct. 26, 2011 in U.S. Appl. No. 13/081,279, 7 pages.
Office Action Response filed Oct. 19, 2011 in U.S. Appl. No. 13/081,279, 4 pages.
USPTO Non-Final Office Action, dated Mar. 16, 2012, U.S. Appl. No. 13/016,599, filed Jan. 28, 2011.
Response to Office Action filed with USPTO on Nov. 21, 2011 for U.S. Appl. No. 13/016,599, filed Jan. 28, 2011.
USPTO Non-Final Office Action, dated Nov. 21, 2011, U.S. Appl. No. 13/016,599, filed Jan. 28, 2011.

* cited by examiner

BROADBAND HIGH POWER AMPLIFIER

RELATED APPLICATIONS

This application is a continuation of Ser. No. 13/081,279 filed Apr. 6, 2011 which was a continuation-in-part of U.S. application Ser. No. 13/016,599, filed Jan. 28, 2011, which claims the benefit of U.S. Provisional Application No. 61/299,072, filed Jan. 28, 2010. This application is also a continuation-in-part of U.S. application Ser. No. 11/629,025, filed Dec. 8, 2006, which is a National Stage of International Application No. PCT/US05/39407, filed Nov. 1, 2005, which claims the benefit of and priority to U.S. Provisional Application No. 60/630,343, filed Nov. 23, 2004. Each of these applications is herein incorporated by reference in its entirety.

FIELD OF THE DISCLOSURE

This invention relates to power amplifiers, and more particularly, to wideband solid-state power amplifiers configured for enhanced thermal-spreading and enhanced frequency performance.

BACKGROUND

A number of electronic systems have a requirement for a high Radio Frequency (RF) power transmitter having performance over a wide instantaneous frequency bandwidth. For example, some electronic counter-measure systems employ Traveling Wave Tube Amplifier (TWTA) technology to achieve the combination of wide frequency bandwidth and high output power performance. Tube based amplifiers, however, are associated with a number of limiting disadvantages. For instance, they are relatively large in physical size, and require very high-voltage power supplies (sometimes thousands of volts).

Present solid-state wideband power amplifiers, using established gallium arsenide (GaAs) transistor technology, offer a smaller size than tube-based approaches but have significantly lower power density and are primarily limited to low to medium RF power applications (usually less than 15 W). In addition, their power density capability requires a significant level of circuit power-combining, which usually limits the obtainable RF output power level.

SUMMARY

One embodiment of the present invention provides a high power amplifier device. The device includes a first plurality of distributed amplification cells connected in a first string, wherein a conductive trace operatively coupling outputs of the first string cells is a stepped structure, such that the associated inductance successively decreases from a first cell to a last cell of the first string. The device further includes a second plurality of distributed amplification cells connected in a second string, wherein a conductive trace operatively coupling outputs of the second string cells is a stepped structure, such that the associated inductance successively decreases from a first cell to a last cell of the second string. The device further includes a combiner for combining output signals of the first and second strings. In one particular such embodiment, each of the first and second strings comprises transistors, and each stepped structure is configured to mitigate parasitic capacitance associated with the transistors of that string. In one specific such case, the transistors are field effect transistors (FETs). In another particular such embodiment, the stepped structure associated with the first string is configured such that voltage input to one cell of the first string is within 5% of voltage input to the other cells of the first string. In another particular such embodiment, the first string is a string pair and the second string is a string pair. In one specific such case, the stepped structure associated with the first string is a shared output line that combines each cell output of the string pair of the first string to provide a first string output, and the stepped structure associated with the second string is a shared output line that combines each cell output of the string pair of the second string to provide a second string output. In one such case, each cell includes a transistor (FET or other suitable transistor technology) and at least one of the shared output lines is a drain line. In another such case, the combiner combines the first string output and the second string output to provide a first intermediate power output. In this example case, the device further includes: a third plurality of distributed amplification cells connected in a third string, wherein a conductive trace operatively coupling outputs of the third string cells is a stepped structure, such that the associated inductance successively decreases from a first cell to a last cell of the third string; a fourth plurality of distributed amplification cells connected in a fourth string, wherein a conductive trace operatively coupling outputs of the fourth string cells is a stepped structure, such that the associated inductance successively decreases from a first cell to a last cell of the fourth string; a second combiner for combining output signals of the third and fourth strings to provide a second intermediate power output; and a third combiner for combining the first and second intermediate power outputs. In another particular such embodiment, a second conductive trace for providing input signal to the first string cells is a second stepped structure, such that the associated inductance successively increases from the first cell to the last cell of the first string, and a second conductive trace for providing input signal to the second string cells is a second stepped structure, such that the associated inductance successively increases from the first cell to the last cell of the second string. In one such case, the first string is a string pair and the second string is a string pair, and the second stepped structure associated with the first string is a shared input line that provides input signal to cells of the first string pair, and the second stepped structure associated with the second string is a shared input line that provides input signal to cells of the second string pair, wherein each cell includes a transistor and at least one of the shared input lines is a gate line. In another particular such embodiment, the device further includes an input stage for dividing an input signal and providing a portion of that input signal to each of the first and second strings, the input stage including a plurality of distributed amplification cells connected in an input stage string, wherein a conductive trace operatively coupling outputs of the input stage string cells is a stepped structure, such that the associated inductance successively decreases from a first cell to a last cell of the input stage string. In another particular such embodiment, the device is an integrated circuit chip. A number of variations will be apparent in light of this disclosure.

For example, another embodiment of the present invention provides an integrated circuit (IC). The IC includes a first plurality of distributed amplification cells operatively coupled in a first string pair, wherein a conductive trace associated with the first string pair is a stepped structure, such that the associated inductance successively decreases from a first cell to a last cell of the first string pair, and wherein the stepped structure associated with the first string pair is a shared output line that combines each cell output of the first string pair to provide a first string pair output. The IC further includes a second plurality of distributed amplification cells operatively coupled in a second string pair, wherein a conductive trace associated with the second string pair is a stepped structure, such that the associated inductance successively decreases from a first cell to a last cell of the second string pair, and wherein the stepped structure associated with the second string pair is a shared output line that combines each cell output of the second string pair to provide a second string pair output. The IC further includes a combiner for combining the first and second string pair outputs. In one particular such embodiment, each of the first and second string pairs comprises transistors, and each stepped structure is configured to mitigate parasitic capacitance associated with the transistors of that string, and at least one of the shared output lines is a drain line. In one specific such case, the transistors are FET, although any suitable transistor technology can be used as will be appreciated. In another specific such case, the stepped structure associated with the first string pair is configured such that voltage input to one cell of the first string pair is within 5% of voltage input to the other cells of the first string pair. In another particular such embodiment, the combiner combines the first and second string pair outputs to provide a first intermediate power output, and the integrated circuit further includes: a third plurality of distributed amplification cells operatively coupled in a third string pair, wherein a conductive trace associated with the third string pair is a stepped structure, such that the associated inductance successively decreases from a first cell to a last cell of the third string pair; a fourth plurality of distributed amplification cells operatively coupled in a fourth string pair, wherein a conductive trace associated with the fourth string pair is a stepped structure, such that the associated inductance successively decreases from a first cell to a last cell of the fourth string pair; a second combiner for combining output signals of the third and fourth string pairs to provide a second intermediate power output; and a third combiner for combining the first and second intermediate power outputs. In another particular such embodiment, a second conductive trace associated with the first string pair is a second stepped structure, such that the associated inductance successively increases from the first cell to the last cell of the first string pair, and wherein the second stepped structure associated with the first string pair is a shared input line that provides input signal to cells associated with the first string pair, and wherein each cell includes a transistor and the shared input line is a gate line. In another particular such embodiment, the IC further includes an input stage for dividing an input signal and providing a portion of that input signal to each of the first and second string pairs, the input stage including a plurality of distributed amplification cells operatively coupled in an input stage string, wherein a conductive trace associated with the input stage string is a stepped structure, such that the associated inductance successively decreases from a first cell to a last cell of the input stage string.

Another example IC embodiment includes a first plurality of distributed amplification cells operatively coupled in a first string pair, wherein a conductive trace associated with the first string is a stepped structure, such that the associated inductance successively decreases from a first cell to a last cell of the first string pair, and wherein the stepped structure associated with the first string is a shared output line that combines each cell output of the first string pair to provide a first string pair output. The IC further includes a second plurality of distributed amplification cells operatively coupled in a second string pair, wherein a conductive trace associated with the second string pair is a stepped structure, such that the associated inductance successively decreases from a first cell to a last cell of the second string pair, and wherein the stepped structure associated with the second string pair is a shared output line that combines each cell output of the second string pair to provide a second string pair output. The IC further includes a third plurality of distributed amplification cells operatively coupled in a third string pair, wherein a conductive trace associated with the third string pair is a stepped structure, such that the associated inductance successively decreases from a first cell to a last cell of the third string pair, and wherein the stepped structure associated with the third string pair is a shared output line that combines each cell output of the third string pair to provide a third string pair output. The IC further includes a fourth plurality of distributed amplification cells operatively coupled in a fourth string pair, wherein a conductive trace associated with the fourth string pair is a stepped structure, such that the associated inductance successively decreases from a first cell to a last cell of the fourth string pair, and wherein the stepped structure associated with the fourth string pair is a shared output line that combines each cell output of the fourth string pair to provide a fourth string pair output. The IC further includes a first combiner for combining the first and second string pair outputs to provide a first intermediate power output. The IC further includes a second combiner for combining the third and fourth string pair outputs to provide a second intermediate power output, and a third combiner for combining the first and second intermediate power outputs. Each of the first, second, third, and fourth string pairs comprises transistors, and the stepped structure associated with the first string pair is configured such that voltage input to one cell of the first string pair is within 5% of voltage input to the other cells of the first string pair.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2b illustrates an equivalent circuit showing parasitic capacitance associated with a transistor shown in FIG. 2a.

DETAILED DESCRIPTION

Figure 1:
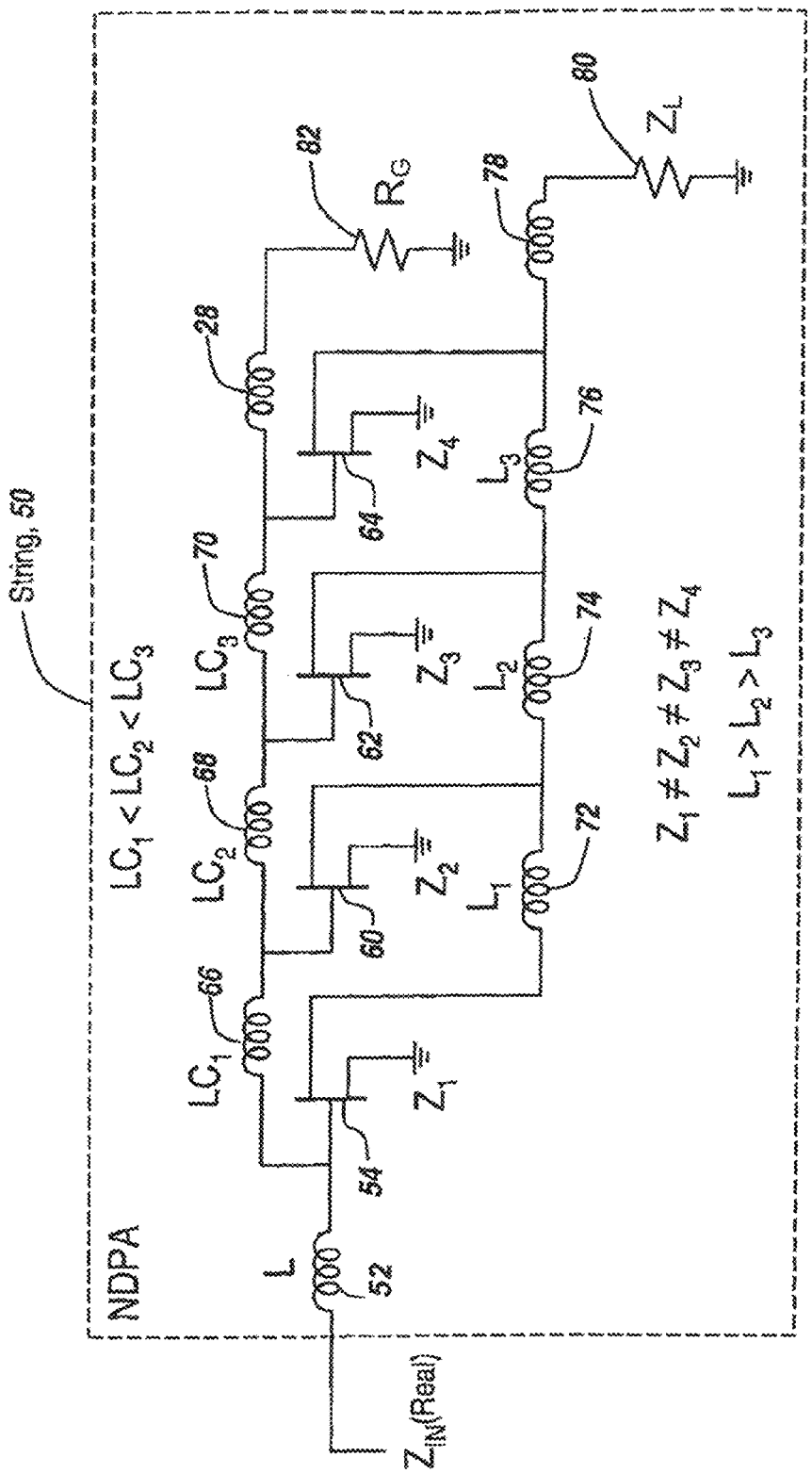
FIG. 1 is a schematic diagram of a non-uniform distributed power amplifier, configured in accordance with an embodiment of the present invention.

Techniques and circuitry are disclosed that enable relatively compact, wideband, high power transmission suitable for numerous military and commercial applications, such as electronic countermeasures and communications jamming, radar systems, software-defined radio architectures, air traffic control and surveillance systems, and communication systems such as wireless base stations. In accordance with one embodiment of the present invention, linear arrangements or "strings" of transistors are used as modular building blocks to achieve higher power monolithic microwave integrated circuit (MMIC) architectures. Any number of string variants and configurations can be made as will be appreciated in light of this disclosure, including those configured to optimally distribute the physical layout topology of a MMIC's active transistors and/or other componentry. Such optimal layout topology provides several advantages relative to sub-optimal layout topologies, as will be apparent in light of this disclosure. For instance, a higher degree of thermal distribution can be achieved that results in a lower junction temperature of the operating active transistors and subsequently, a corresponding associated improved electrical performance. Also, the layout techniques provided herein can be used to enable less complex microstrip-integrated-circuit (MIC) elements to replace more complex spiral inductors that handle the requisite DC currents, in accordance with some embodiments. In addition, as the upper frequency of the amplifier increases, it may be desirable to minimize the line lengths between the parallel connected strings. The layout techniques and string variants provided herein facilitate such line length reduction.

General Overview

The ability to achieve high power, wide bandwidth solid-state amplification using compact, monolithic microwave integrated circuits (MMICs) is very desirable in advanced transmitter applications. For example, this is especially relevant in designs requiring greater than 4:1 bandwidths and tens of watts or greater of MMIC output power. A significant contributor to the output power/bandwidth limitation is the low impedance levels exhibited by conventional large-periphery transistors required in high-power applications.

In more detail, conventional high power MMIC architecture typically employs resistive or reactively matched large-periphery transistors in multi-stage power amplifier circuit topologies with lossy combiners/dividers. Achieving high power with such conventional reactive and resistive matched power amplifier configurations has limitations due to the low real-impedance levels and parasitic reactance exhibited by use of large-periphery devices for high output power. The lower impedance of conventional devices limits their usefulness in ultra-wideband power applications because large impedance transformation ratios are needed which limit broadband performance. Moreover, the device reactance complicates the combining of these devices to further decrease output power levels. In addition, conventional large-periphery devices exhibit more localized heating than a distributed device approach. On the other hand, conventional distributed amplifiers, which exhibit wide frequency bandwidth performance under small-signal applications, typically require a termination balance resistor in their drain line which limits the power that can be delivered to a desired load for these types of amplifiers.

One way to address such limitations, and in accordance with various embodiments of the present invention, is with the use of transistor strings as modular building blocks. A MMIC circuit design configured in accordance with one such example embodiment includes a non-uniformly distributed power amplifier (NDPA) architecture. The architecture addresses the problem of achieving higher power and bandwidth on MMICs by utilizing small, efficient transistor-based cells integrated into 1-dimensional device arrays (strings). In some such embodiments, each string can be further re-distributed into strings that share either a common drain or gate distribution line. Each NDPA string can be configured to provide a quasi-real, non-reactive circuit impedance over a ultra-wide frequency bandwidth. The resulting MMIC architecture is more thermally distributed and improves the power-over-bandwidth performance available from a single die.

Also, combining multiple drain lines into a single shared-drain-line reduces the inductance required between device cells. As a result, and in accordance with some embodiments, a microstrip transmission line can replace a spiral inductor, leading to a higher current handling implementation. The reduction of multiple drain or gate lines into a single line also minimizes the impedance variation versus frequency of parallel combined strings. The subsequent power combining of these NDPA strings, along with the advantage of cascading multiple stages of amplification that do not exhibit large reactance variation with frequency, enables MMIC power chips to achieve a power-bandwidth figure-of-merit not achievable with conventional reactive/resistive impedance matching approaches.

Some example power amplifier MMICs configured in accordance with an embodiment of the present invention are capable of greater-than-50-watts of output power using, for example, current Gallium Nitride (GaN) solid-state technology. Such power amplifier MMICs can be used as a solid-state replacement for a TWTA. Other applications will be apparent in light of this disclosure. The selectively distributed nature of the NDPA strings as described herein can be used, for example, to significantly improve thermal management of the active devices on a single power amplifier MMIC. As such, the associated lower operating temperature of the MMIC results in improved electrical performance, reduced thermally induced de-rating due to temperature, and improved reliability. An additional degree of freedom in circuit element design for current handling is also provided, given a shared gate or drain line configuration, as well as a reduction of added impedance variation due to physically interconnecting multiple strings.

Power Amplifier Circuit Schematics

FIG. 1 is a schematic diagram of a non-uniform distributed power amplifier (NDPA) configured in accordance with one embodiment of the present invention. As can be seen, the NDPA includes three terminal transistor cells and the characteristic impedance of the transmission line networks operatively coupling the cells varies between each cell, and is configured such that the input and output impedances only have real components (or an otherwise negligible imaginary component, with respect to a given application). Further note the ascending gate inductances from input to output, and the decreasing drain inductances from input to output, so as to establish sufficiently equal voltage/current characteristics for the transistors of the string. As will be appreciated in light of this disclosure, note that use of the term equal or identical is not intended to require precise equality; rather, the voltage/current characteristics for the transistors of the string are equal within an acceptable tolerance (e.g., voltage/current characteristics are within +/−10% of each other, or better).

In one such specific example implementation, this power amplifier configuration can be used to enable realization of high efficiency MMIC power amplifiers capable of ultra-wide frequency bandwidth operation that can be used to form a traveling wave amplifier composed of cell strings in which each transistor device has sufficiently identical voltages and currents (within a given tolerance). Thus, in each string of this example embodiment, every amplifying device is driven by substantially the same gate voltage (e.g., such that the gate voltages are all within +/−10% of each other, or within +/−5% of each other, or within +/−2% of each other, or within +/−1% of each other).

One way to achieve sufficiently identical voltages and currents (within a given tolerance) is to vary the characteristic impedances of each interconnecting line segment (i.e., line segments between transistors of a given string) with respect to each other. Such a configuration can be used to maximize gain at the expense of bandwidth, as there is a trade-off between gain and achievable bandwidth associated with gate line termination. However, in some such embodiments, bandwidth can be increased by artificially lowering the line impedances and the adding a resistive load $R_G$ on the gate line. The specific impedances (e.g., inductances) making up the input and output transmission line segments of each cell can be initially selected according to the following example procedure. Note, however, that such procedure is not required, and other techniques can be used to determine specific input and output transmission line segment impedances of each cell suitable for a given application (including any theoretical modeling and/or empirical analysis), as will be appreciated in light of this disclosure.

In accordance with one embodiment of the present invention, the input and output equivalent circuits of a transistor cell can be represented by a shunt resistor-capacitor (RC) network. For example, and assuming a FET-based cell, the gate (input) of the cell can be modeled as an RC circuit to ground. Likewise, the drain (output) of the cell can be modeled as an RC circuit to ground. The parallel capacitance is thus compensated with a series inductance such that the resulting L-network approximates the desired line characteristic impedance over a broad bandwidth of interest. The characteristic impedance (Z) of the L-network is generally given by, $Z=\sqrt{L/C}$. Therefore, the inductance as a function of the required characteristic impedance may be obtained from $L=Z^2 \times C$. As the operating frequency begins to approach the cutoff frequency defined by, $f_c=1/(\pi\sqrt{LC})$, the reflection coefficient rises markedly. Since the capacitance usually cannot be reduced because it is determined by the active devices (FETs, in this example case), it is necessary to lower the operating impedance in order to reduce the LC product and raise the cutoff frequency. This tradeoff is usually only relevant to consider for the input RC network since the input capacitance of field effect transistor (FET) devices is typically 10 to 100 times the output capacitance.

Figure 2A:
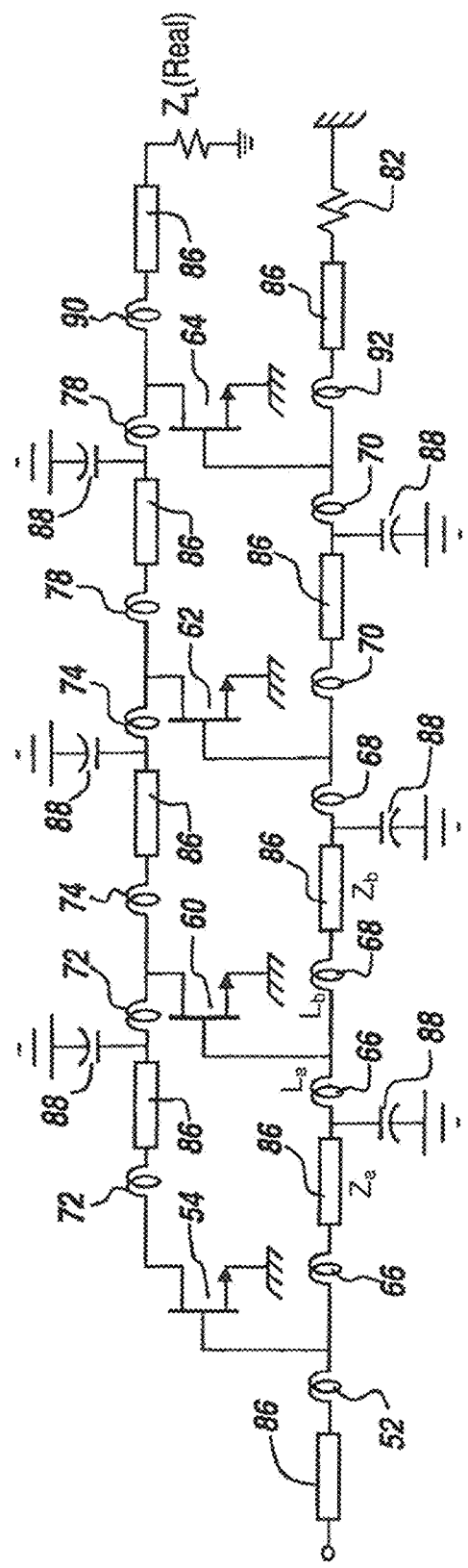
FIG. 2a is a schematic diagram of a non-uniform distributed power amplifier, configured in accordance with another embodiment of the present invention.
Figure 2B:
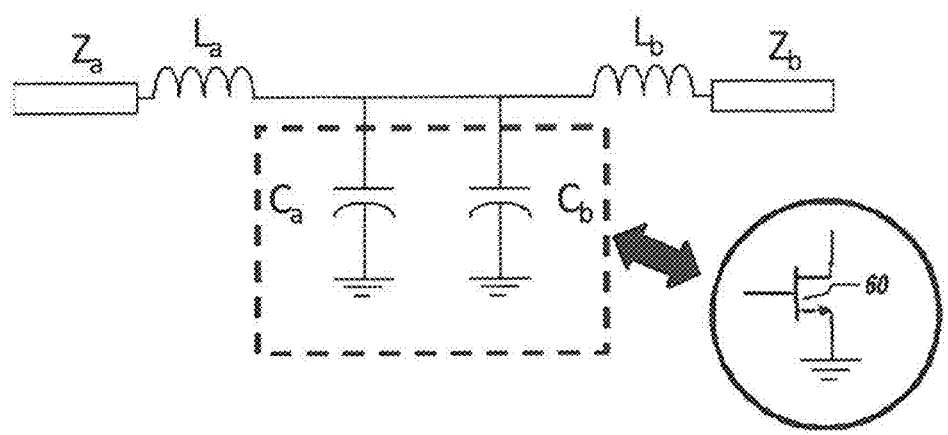

In the non-uniformly distributed power amplifier of FIG. 1, each active device (FETs in this example embodiment) is located at a junction of two transmission lines of differing characteristic impedance. A more detailed equivalent circuit is shown in FIGS. 2a and 2b. As can be seen, the equivalent capacitance (C) of a transistor cell can be apportioned into two capacitances which can be incorporated with the inductors associated with the connecting lines so as to maximize the overall cutoff frequency. More specifically, $C_a$ and $C_b$ represent portions of transistor 60 parasitic capacitance that will be absorbed with $L_a$ and $L_b$, respectively, to form synthetic transmission lines $Z_a$ and $Z_b$. Note that $C_a$ and $C_b$ are not equal. The maximum will occur when $fC_a=fC_b$, where $C_a$ and $C_b$ are the respective equivalent capacitances apportioned to the preceding and succeeding transmission line segments between transistor cells in the string (e.g., on the gate line and/or drain line). Under this condition $L_aC_a=L_bC_b$, where $L_a$ is the inductor corresponding to $C_a$ and where $L_b$ is inductor corresponding to $C_b$, as best shown in FIG. 2b with reference to the gate line of transistor 60. Thus, $C_a^2 \times Z_a^2 = C_b^2 \times Z_b^2$, from which $C_a=(Z_b/Z_a)C_b$. Since the total capacitance associated with a transmission line segment 86 between two transistors can be computed as $C=C_a+C_b$, $C_a=[C/(Z_a/Z_b)]$, and $C_b=[C/(Z_b/Z_a)]$. Therefore, it follows that $La=(Z_a^2 \times C)/[1+(Z_a/Z_b)]$, and $L_b=(Z_b^2 \times C)/[1+(Z_b/Z_a)]$.

To summarize the method of impedance selection with regard to the example embodiment of FIGS. 1 and 2a-b, the initial theoretical characteristic impedances of input line segments 86 of the gate line are selected so that the same voltage (within an acceptable tolerance) is presented to the gates of each transistor 54, 60, 62, and 64. For instance, and as best shown in FIGS. 2a-b, the inductances $L_a$ and $L_b$ are a function of the characteristic impedances $Z_a$ and $Z_b$ of the second and third input line segments 86 on the gate line (from the left). In general, the bandwidth of the amplifier is determined by the cutoff frequency of the input line segments. Thus, and in accordance with one example embodiment, the inductances $L_a$ and $L_b$ and the transmission line 86 for each input line segment are chosen to maximize the cutoff while compensating for capacitances $C_a$ and $C_b$ of the transistors (e.g., 54, 60, 62, and 64). In some such embodiments, the resistance $R_G$ in the gate line can be used to terminate line segments and prevent reflections. On the output line, the characteristic impedances of the output line segments 86 of the drain line are a function of the optimal load impedance of the transistor devices. Just as with the gate line inductances, the drain line inductances (72, 74, and 78) are chosen to compensate for the parasitic drain capacitances of the active devices 54, 60, 62, and 64. For example, and as best shown in FIG. 2a, the capacitance of a transistor 62 is compensated by the inductances 74 and 78, with the total required compensating inductance being appropriately apportioned by the ratios, $La=(Z_a^2 \times C)/[1+(Z_a/Z_b)])$ and $L_b=(Z_b^2 \times C)/[1+(Z_b/Z_a)]$, where $C=C_a+C_b$, $C_a=[C/(Z_a/Z_b)]$, and $C_b=[C/(Z_b/Z_a)]$. In one particular example embodiment, the output transmission line segments 86 are chosen so that the delay along the output drain line matches the delay along the input gate line while meeting the required characteristic impedance.

As will be appreciated, this example method for setting the inductances used in segments between string transistors represents an idealized value of those inductances. The process of implementation of those values may necessitate deviating from the theoretical values to enable the physical layout of components and to compensate for additional parasitics. The theoretical values, therefore, enable a methodology for deciding what is and what is not physically achievable, and what can be adjusted or otherwise refined to be physically realized.

Thus, a theoretical implementation can be further refined, for example, through iterative empirical analysis and optimization. Once a specific layout and manufacturing process are selected, it is reasonable to conclude that the design will remain sufficiently stable and perform in a predictable manner.

The values for the inductance, characteristic impedance, and delay (phase) compensation are calculated from the mathematical expressions that relate the capacitance and resistance characteristics of the transistors (or other suitable amplifying devices) to the desired impedance taper of the gate and drain lines. Each network from gate-to-gate and from drain-to-drain can be calculated in this manner, in accordance with some embodiments of the present invention. In accordance with one such example embodiment, the realization of these element values for a MMIC implementation satisfy a number of physical requirements in addition to the electrical characteristics, as will be appreciated in light of this disclosure.

For example, in one such embodiment, the transmission lines can be implemented with microstrip traces, wherein the line widths of the microstrip traces in the drain line are wide enough to handle the current in that portion of the amplifier, which is a function of where the drain bias is injected. For instance, if the string is biased from the output end of the string, the microstrip trace at the output must be wide enough to handle all of the bias current, or n×Ids$_n$, where n is the number of cells/transistor devices in that string and Ids$_n$ is the drain current in the corresponding transistor. Thus, the final drain line segment must handle (n×Ids) current from all transistors, the next prior drain line segment must handle (n−1)× Ids, the next prior drain line segment must handle (n−2)×Ids, etc down to the first drain line segment, which handles just Ids. In addition, the total length of the microstrip traces between the devices can be long enough to allow their physical layout without overlap. Also, the total gate-to-gate length of the traces and the total drain-to-drain length of the traces are compatible for layout. For very wide lines, with minimal bending possible, this is equivalent to saying that their total lengths are roughly equal. In areas of low current handling, such as the case with a string's gate line due to high gate impedance, the narrower line widths allow meander, or bent traces.

Given such layout constraints, the overall electrical characteristics of the device-to-device interconnect are generally more relevant than the individual element values of that interconnection. Using computer aided design software, such as Agilent's Advanced Design System (ADS) or other suitable modeling systems, the ideal-element to microstrip-trace equivalent can be readily accomplished. As will be further appreciated in light of this disclosure, the circuit architectures provided herein can be configured to exploit the advantages of using small gate-periphery, high-efficiency transistor (e.g., FET) devices or cells in a distributed monolithic cascade of solid-state devices interconnected with transmission lines of progressively varying characteristic impedance. Note that when utilizing multiple cells, the transmission line characteristic impedance changes. For instance, in some example configurations, the highest impedance part on the load side is at the first transistor cell of a string and the impedance is stepped down to the desired load impedance (e.g., 50 ohms or other suitable load impedance, depending on the application). The impedance on the gate line can be configured in an opposite fashion (e.g., lowest impedance part is at the first transistor cell of a string and the impedance is stepped up to a desired gate-line termination impedance.

With reference to the example embodiment of FIG. 1, a non-uniformly distributed power amplifier is in the form of a string 50 that exhibits a real impedance at its input and output terminals over several octaves of frequency bandwidth, enabling simplified low-pass and band-pass impedance-transforming networks to be used to combine several strings into a wideband, high-power amplifier MMIC of a prescribed output power. In this case, there is an input $Z_{IN}$ that is real, which is applied across an inductor 52 to the gate of a first transistor 54, which has a grounded source and an output at its drain. The transistors 54, 60, 62 and 64 of this example embodiment are implemented with FETs, and are connected in parallel such that their gates and drains are connected together. Between each of the transistor gain cells is a gate inductor, respectively 66, 68 and 70, and the drains of each stage are interconnected through inductors 72, 74 and 76. Note that the output (from the drain line of string 50) includes termination inductor 78 and is across a load 80, which has a real load impedance ($Z_L$). In a similar fashion, the gate line of string 50 is terminated in a real load 82 ($R_G$) via inductor 28.

As can be further seen in this example embodiment, the value of the drain line impedance (and specifically, the drain line inductance) decreases from a high at the input end to a low at the output end, whereas the impedance (inductance) for the gate line increases from the input end to the output end. The transistors themselves can be sufficiently identical so that the transmission line impedances between cells are purposely made unequal by configuring the inductances such that across all frequencies of interest, the current/voltage characteristics of the transistors are identical (or otherwise within an acceptable tolerance, such as within +/−10% of each other). With the respective currents and voltages sufficiently equal, there is no need for a drain resistor (which will limit output power). As will be further appreciated, a string composed of individual cells and having input and output impedances exhibiting only real components, it is possible to replicate identically configured strings and interconnect them together for power amplification purposes.

A variation of the circuit of the example embodiment of FIG. 1 is shown in FIG. 2a in which like elements have like reference characters (although specific values and/or other details of those similarly labeled elements may be different, as will be appreciated in light of this disclosure). As can be seen, FIG. 2a includes inter-device inductances (66, 68, 70, 72, 74, and 78) and transmission line lengths (86), with the inductances and phase matching set by the traces associated with the drain or the gate of the transistors 54, 60, 62, and 64. As previously explained, the length of the transmission line 86 between each of the cells can be configured for phase matching purposes such that phase coherence is preserved from one amplification device to the other. As further shown in the example embodiment of FIG. 2a, a number of small Metal-Insulator-Metal (MIM) capacitors 88 can be provided to dielectrically load the transmission lines 86, lowering their effective characteristic impedance and raising their effective dielectric constant. Note that, in some embodiments, the inductors 66, 68, 70, 72, 74, and 78 straddle the associated transmission lines 86 used for phase matching, while in other embodiments the inductors 66, 68, 70, 72, 74, and 78 are integrated into the transmission line 86 itself.

An inductor 90 is inserted at the output of the output transistor 64, and an inductor 92 is inserted at the termination end of gate line of the output transistor 64. Having established that the voltages and currents are substantially the same across each of the transistors/cells, the power output of the amplifier is maximized with respect to frequency, while at the same time providing input and output impedances having no or otherwise negligible reactive components. This internally matched aggregate power amplifier architecture may be configured to provide significantly higher monolithic chip power over a broader frequency bandwidth than is currently available with conventional circuit approaches.

As will be appreciated, note that the non-uniform distributed power amplifier strings may be replicated such that the design may be re-used to extend the architecture to higher output power levels without the requirement of extensive new designs. Thus, the string approach provided herein allows for a very high output power-bandwidth figure of merit, and can be implemented using a single integrated circuit chip or chip set in accordance with some embodiments. A wide variety of broadband power amplifiers with varying output power levels can thus be achieved with only one type of fundamental transistor cell in a monolithic cascade of transistors that constitutes a string. In one example case, the power level of a MMIC chip can be selected by integrating the appropriate number of strings using, for example, low pass and/or band pass impedance matching networks, which simplifies the semiconductor fabrication process. In this sense, the amplifier design can effectively be decoupled from the device development, and optimal amplifier configurations can be achieved without the need to develop multiple gate periphery and application-specific devices. Moreover, the higher power architecture permits revising the strings, as well as lowering design cycle time and associated design costs for high-power amplifiers, in accordance with some embodiments.

The non-uniform distributed nature of the amplifier offers several inherent reliability enhancements not readily available from conventional wideband power amplifiers. For instance, and in accordance with one such embodiment, each device in the string array is stressed equally, meaning that each device experiences sufficiently identical voltages and currents (within an acceptable or otherwise negligible tolerance). Moreover, the thermal dissipation is more distributed when contrasted with very large-periphery power transistors used in conventional amplifier circuits. This reduced proximity heating enables, for example, a resulting NDPA MMIC to have lower junction temperatures, in accordance with an embodiment of the present invention.

As will be further appreciated in light of this disclosure, each string can be designed in a manner that effectively cancels or otherwise mitigates parasitic capacitance of transistors within the string, enabling broader bandwidth and lower loss filter matching networks. In addition, the impedance presented over extended frequency bandwidths at each input and output of a string is nearly real and higher than that of a comparable-sized unmatched large periphery power transistor, in accordance with some embodiments. These features result in higher impedance transformation ratios when combining several strings, facilitating inherent broadband performance. The overall output power level of a NDPA MMIC configured in accordance with an embodiment of the present invention can be set, for example, by the number of transistor cells arrayed or integrated in each string and by the total number of strings on the chip. The real impedance feature of the strings significantly facilitates impedance transformation networks that evolve the strings into single internally-matched power amplifier MMICs that are completely compatible with, but not limited to, current wafer fabrication techniques, such as a complementary metal oxide semiconductor (CMOS) process using material systems such as GaAs, Indium Phosphide (InP), GaN, Silicon Germanium (SiGe), etc.

Figure 3:
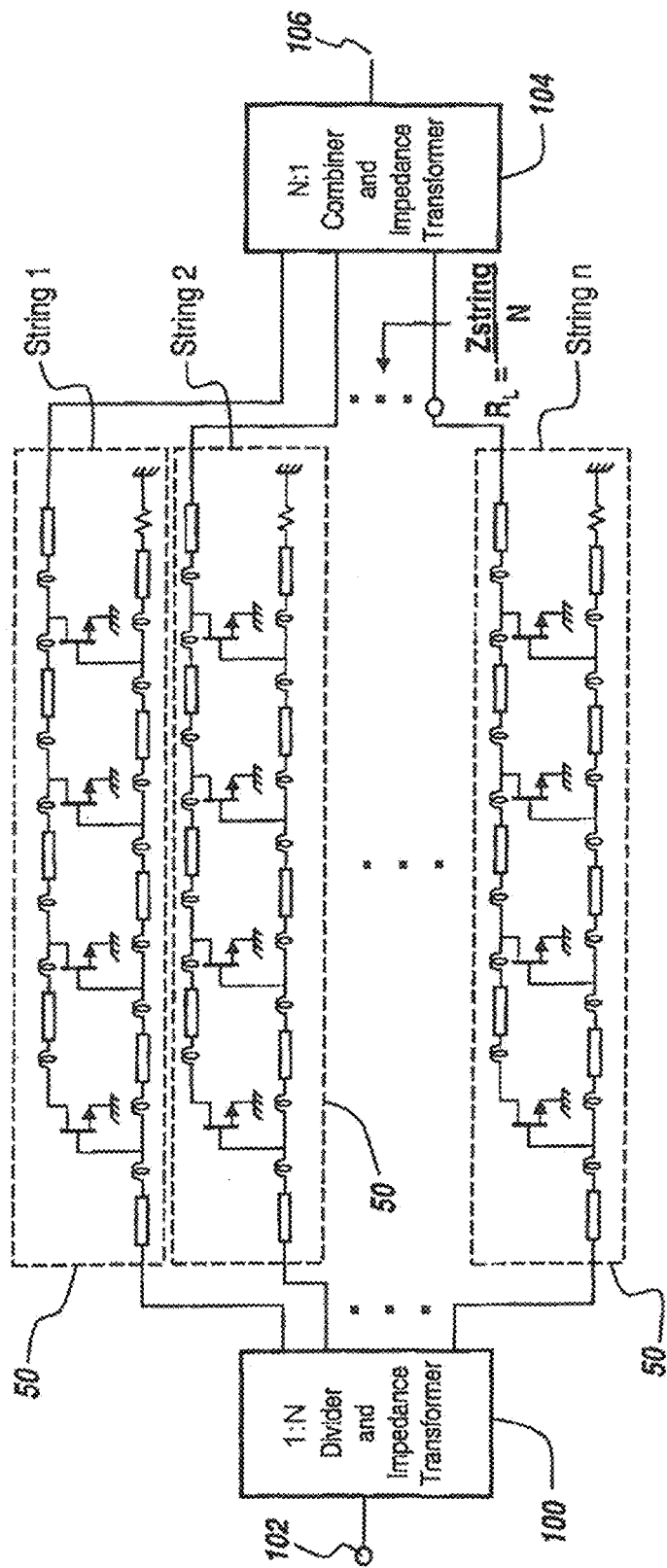
FIG. 3 is a schematic illustration of four parallel strings to provide an ultra-wide bandwidth distributed amplifier with increased power output, in accordance with an embodiment of the present invention.
Figure 4:
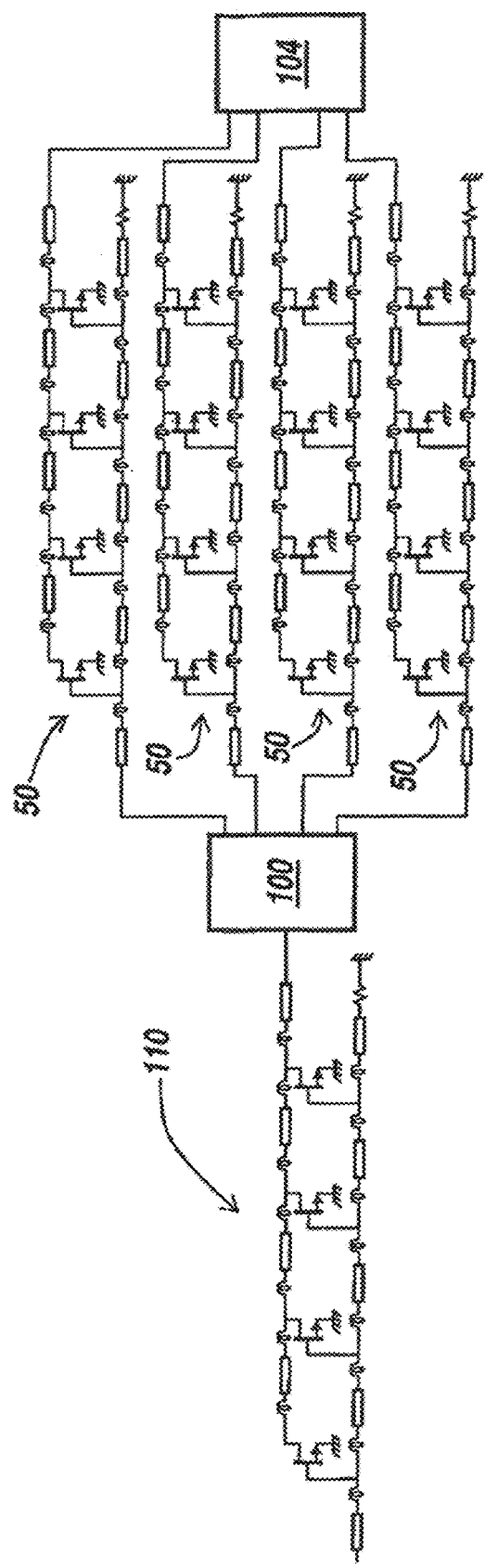
FIG. 4 illustrates the driving of the four strings of the distributed amplifier of FIG. 3 with an identically configured string driver, in accordance with an embodiment of the present invention.

Referring now to FIG. 3, a number of strings 50 are parallel-connected as illustrated utilizing an 1:N divider and impedance transformer 100 to split and match an input at 102 and apply it to the gate terminals of the transistors in each of the strings. The drains of the strings are combined by an N:1 combiner and impedance transformer 104 to provide the amplified output at 106. In one example such embodiment, the amplifier is implemented in a MMIC configuration, and the impedance matching topology and the dividing/combining networks use low pass impedance matching and dividing/combining networks. These matching or dividing/combining networks can thus be made, for example, in the conventional low pass form and can be synthesized from general filter theory. Alternatively, band pass and high pass impedance matching and dividing/combining networks of lumped or distributed form can be used. As can be further seen with this example embodiment, the output impedance to be matched is in the form of a resistive load ($R_L$), which is equal to $Z_{string}/N$, where $Z_{string}$ is the output string impedance and N is the total number of strings. In one example configuration, this output impedance is generally 50 ohms (e.g., +/−5 ohms). FIG. 4 illustrates a solid-state power amplifier that includes the parallel-connected strings of FIG. 3 and a driver implemented with an identically configured string 110, which is coupled to the divider and impedance transformer 100.

Figure 5:
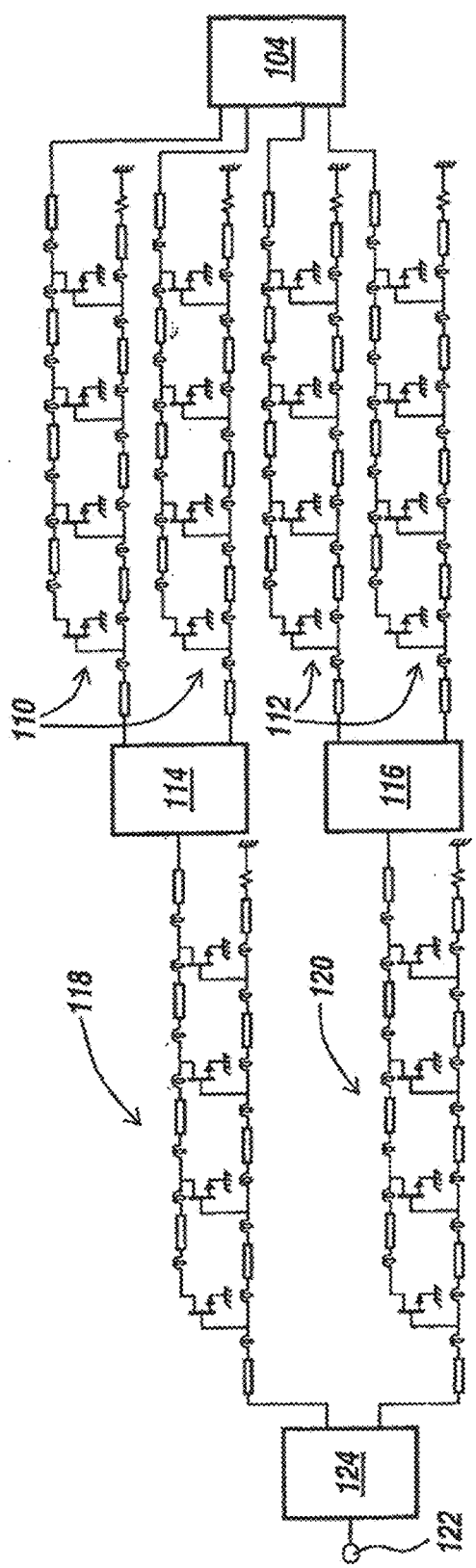
FIG. 5 is a schematic diagram showing two halves of a four-string power amplifier stage using two separate drivers, in accordance with an embodiment of the present invention.

Referring to FIG. 5, another way to drive the four strings of the example embodiment shown in FIG. 3 is to divide the power amplification stage into two pairs of strings (string pair 110 and pair string 112), and by providing each of the pairs with a separate divider and transformer as illustrated respectively at 114 and 116. The 1:2 dividers 114 and 116 are separately driven by strings 118 and 120, which are in turn driven by an input 122 that is divided out and provided via a 1:2 divider and impedance transformer 124. The drains of the four strings are combined by the 4:1 combiner and impedance transformer 104 to provide the amplified output.

Figure 6:
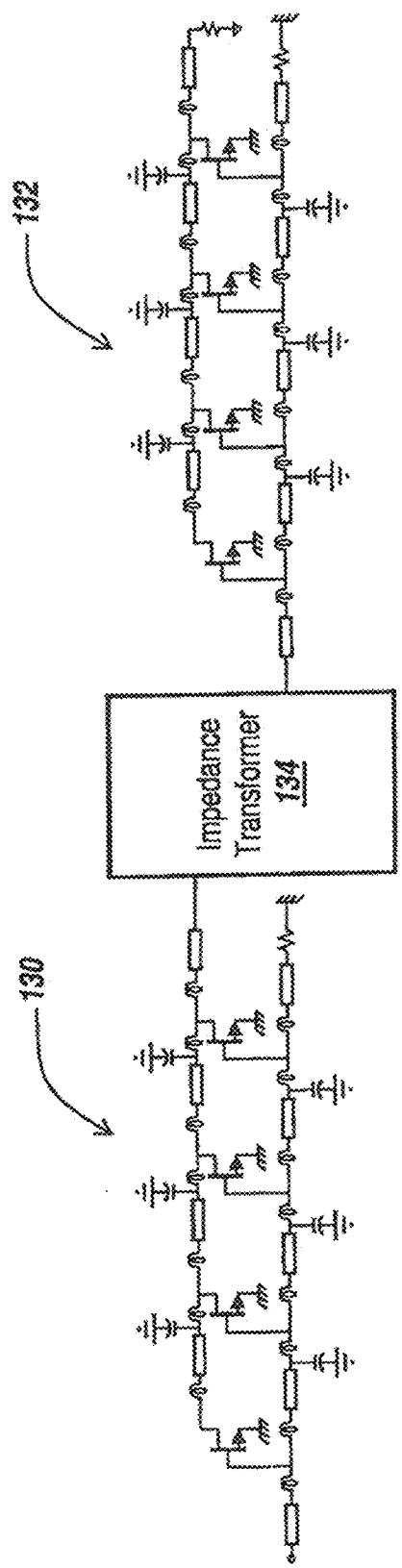
FIG. 6 is a schematic illustration of one string cascaded with another by way of an integrated impedance transformer, in accordance with an embodiment of the present invention.

FIG. 6 is a schematic illustration of one string cascade with another via an integrated impedance transformer. In this example embodiment, string 130 is cascaded to a string 132 through impedance transformer 134. Note that any number of strings can be cascaded in this fashion. As previously explained, the impedance transformer 134 can be implemented, for example, using conventional impedance transformer technology and standard process techniques.

Figure 7:
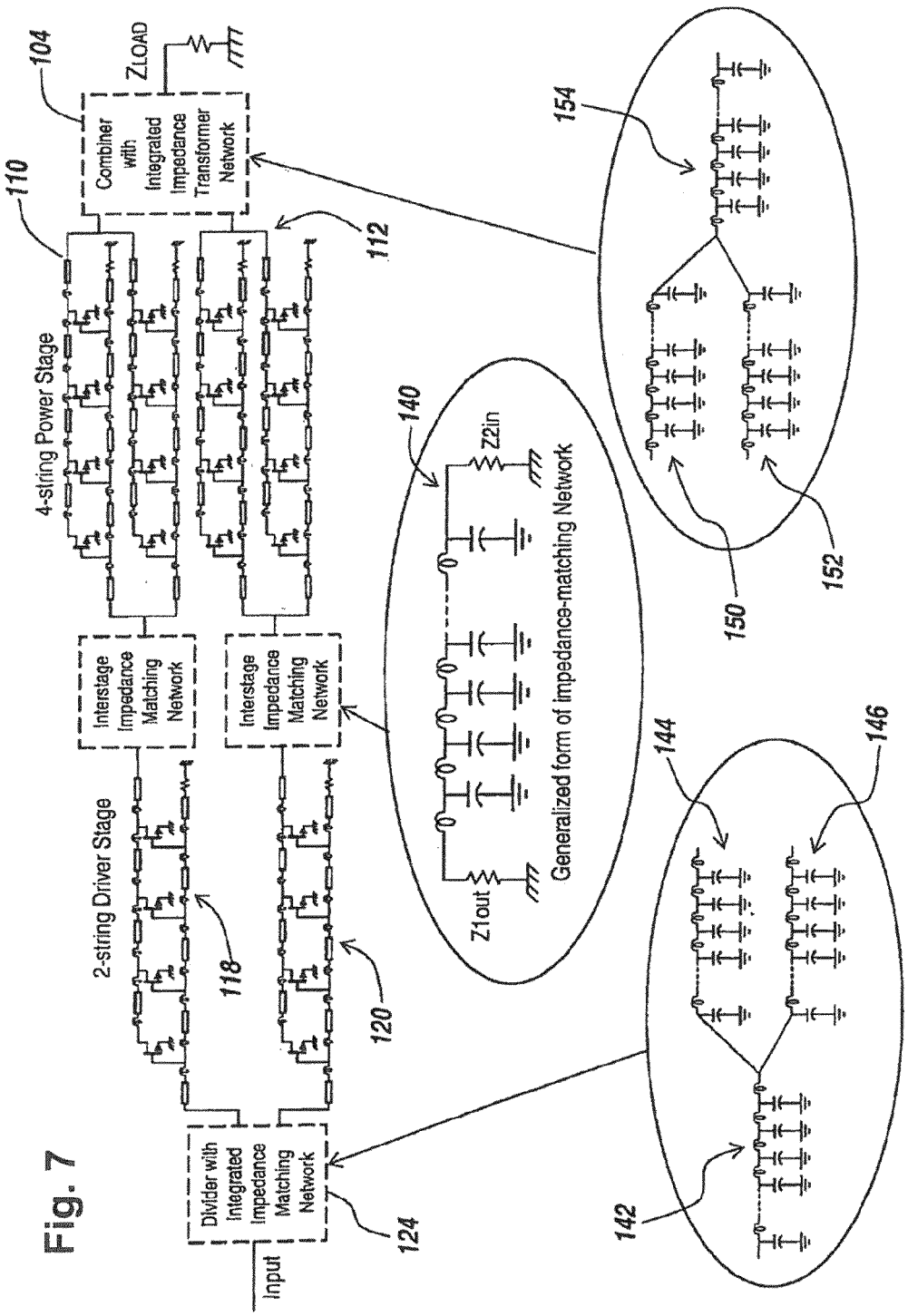
FIG. 7 schematically illustrates an example interstage impedance matching network, as well as a divider and combiner fabricated with associated impedance matching using the same topology, in accordance with an embodiment of the present invention.

FIG. 7 is a schematic showing an example impedance matching network as well as divider/combiner networks for use in coupling strings together, each fabricated with associated impedance matching, using similar topology. In this example case, a two-string driver stage comprised of strings 118 and 120 is provided, each of which receives its input from a corresponding output of a divider 124. The 1:2 divider 124 receives an input signal and is configured with an integrated impedance matching network having low pass filter topology, which in this example configuration includes network 142 comprising a series of inductor elements and parallel capacitors. The output of network 141 is split and provided in substantially equal shares to networks 144 and 146, thereby providing the dividing function. The outputs of strings 118 and 120 are operatively coupled to a four string power stage by corresponding interstage impedance matching networks 140. With respect to the generalized form of network 140, Z1out represents the string impedance of the driver stage, and Z2in represents the string impedance of the power stage (which in this example case is a string pair). In a similar fashion to divider 124, for the four-string power stage comprising the double strings 110 and 112, combiner and impedance transformer network 104 may be formed by impedance matching networks 150 and 152 coupled together with an impedance matching network 154. The resulting circuit provides a broadband, multi-octave, high-power amplifier. Note that the integrated impedance matching networks and combiner/dividers can be readily fabricated in MMIC topology. As will be appreciated in light of this disclosure, the matching networks can be derived from filter synthesis and can be, for example, maximally flat or Chebyshev networks of a sufficient number of sections to achieve the desired bandwidth. Numerous other suitable combiner/divider plus impedance matching network schemes can be used here, depending on factors such as desired bandwidth, input reflection, and frequency range of interest.

Power Amplifier Layouts

Figure 8:
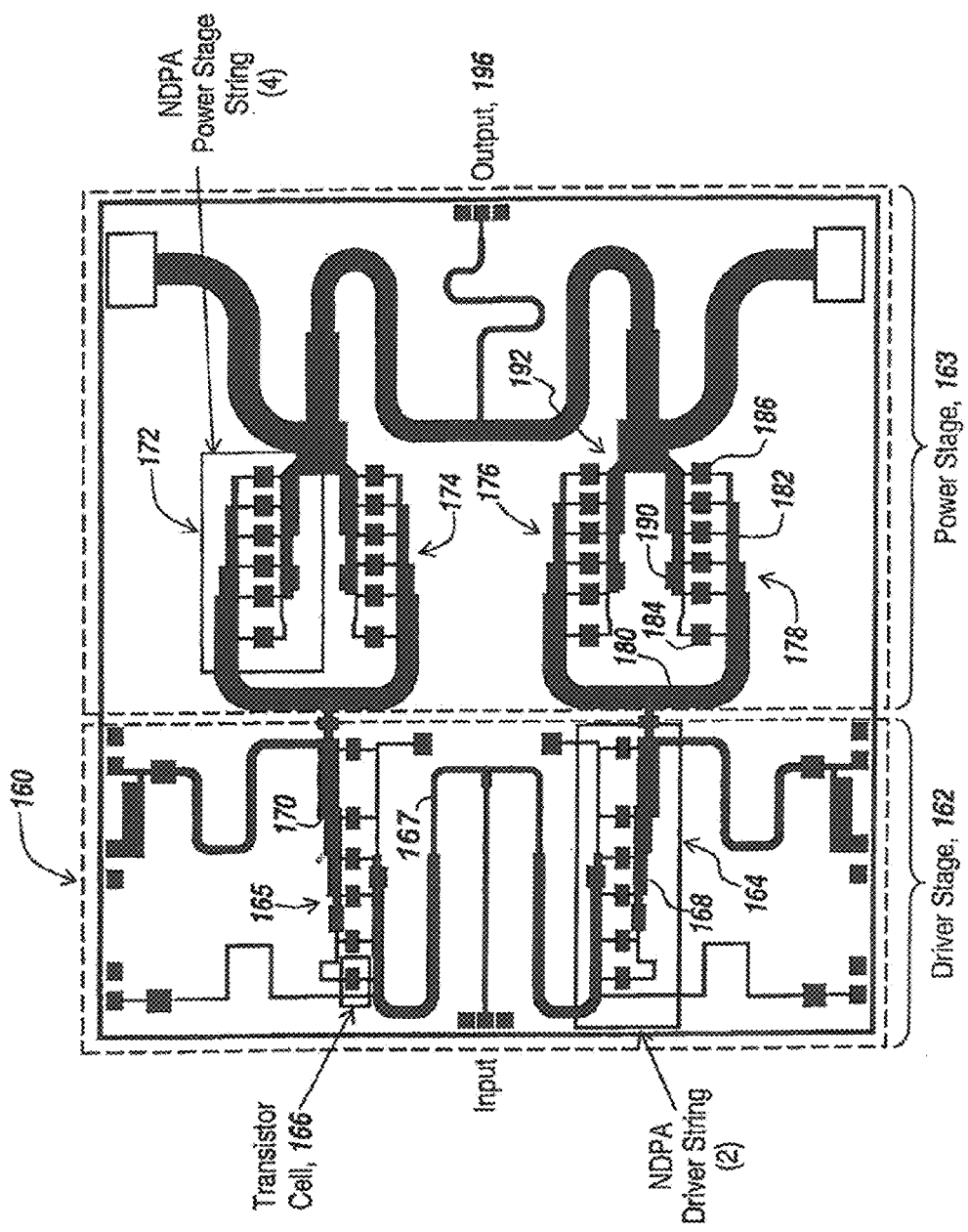
FIG. 8 is a top view of the topology for a high power amplifier configured in accordance with an embodiment of the present invention.

FIG. 8 is a top view of the topology for a driver stage 162 and a power stage 163 of a high power ultra-wide bandwidth amplifier implemented using MMIC technology, in accordance with an embodiment of the present invention. This example layout corresponds to the circuit of FIG. 7, and can be monolithically formed on a chip, here designated chip 160. Each of the stages utilizes non-uniform distributed power amplifier strings. Note that the layout provided in FIG. 8, as well as the example layouts of FIGS. 9-11, exhibits a degree of symmetry and that description provided with respect to a particular layout area will equally apply to like areas.

The driver stage 162 of this example embodiment comprises two monolithically formed non-uniform distributed amplifier strings 164 and 165 that include a number of transistor cells 166, which can be implemented, for example, with FETs or other suitable amplification technology. As will be appreciated in light of this disclosure, the transistor cells 166 can be interconnected with traces that form both inductors and phase matching segments. In this particular example case, the gate trace receives the input signal and is configured with a stepped structure 167 that increases in impedance from input to gate line termination of the driver stage 162. In addition, the drain traces that form the output of the transistor cells 166 are stepped inductor traces 168 and 170, which decrease in impedance (inductance) from input to output of the driver stage 162. As can be further seen, each of the gate and drain lines are operatively coupled with traces connected to bias input/output (I/O) circuitry located at the perimeter of the driver stage 162.

The power stage 163 includes strings 172, 174, 176 and 178. Referring now to string 178, the traces 180 form a divider and impedance transformer between the output of string 164 and the input to strings 176 and 178. At the right side of these traces 180 is a stepped structure 182 that steps the impedance on the gate electrodes from the first transistor 184 to the last transistor 186, such that the associated inductance successively increases from input to output of the string. As to the drain electrodes of these transistors, traces 190 form inductances between the transistors that successively decrease from input transistor 184 to output transistor 186.

Strings 176 and 178 have their outputs combined by trace 192, which functions to combine the outputs, to inject the drain bias, and to perform an impedance matching function as previously explained. In a similar fashion, note that the combined outputs of strings 172 and 174 are combined with the combined outputs of strings 176 and 178 to provide a combined signal at output 196 of amplifier 160. The combining/dividing and impedance matching networks can be implemented, for example, with microstrip. Note, however, that they can also be realized in coplanar waveguide, stripline, meanderline, or any suitable form. Further note that the traces between the transistors can function both to provide the required inductances and to perform phase matching in terms of their length such that throughout a given string, the outputs of the various transistor amplifiers within the string are in phase. Further note that the inputs and outputs of the strings are predominantly composed of real impedances to facilitate inter-string matching.

Figure 9:
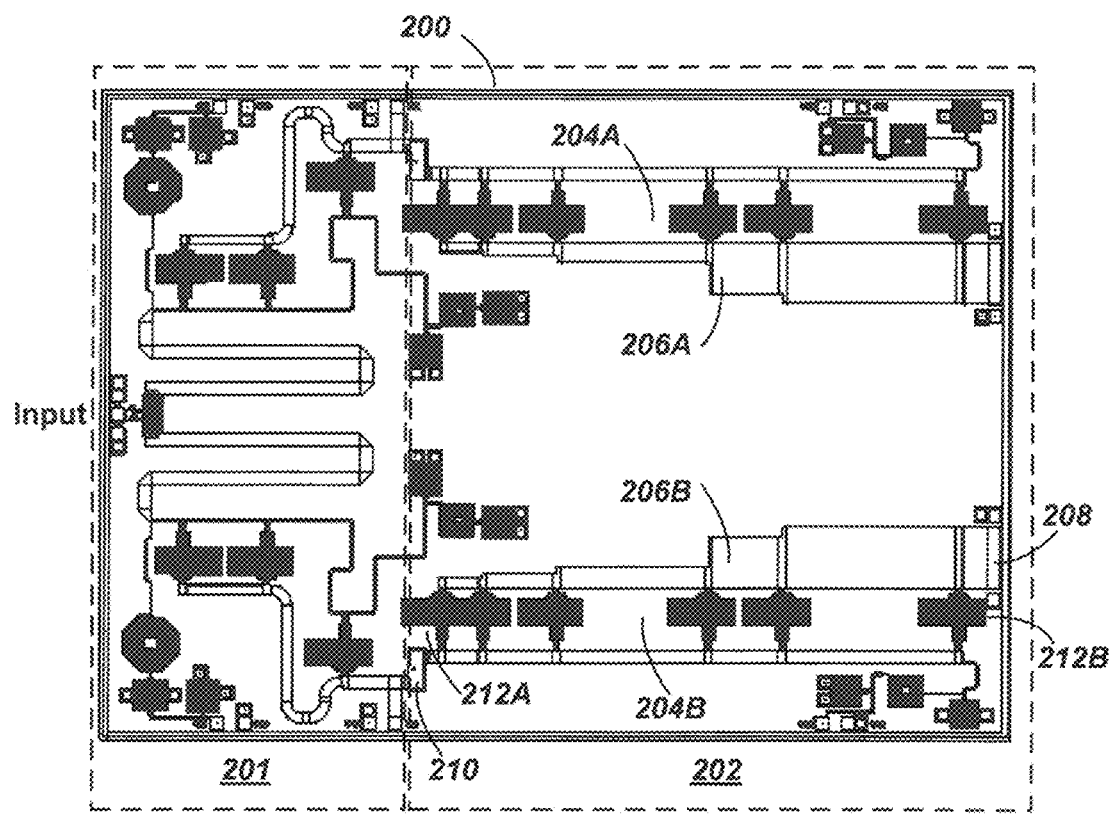
FIG. 9 is a top view of the topology for a high power amplifier configured in accordance with another embodiment of the present invention.

FIG. 9 is a top view of the topology for a high power amplifier 200 configured in accordance with another embodiment of the present invention. Similar to the example configuration shown in FIG. 8, this example embodiment includes a driver stage 201 and a power stage 202. In addition, each stage is configured with its own gate and drain lines (non-shared topology).

The drive stage 201 in this example can be implemented as conventionally done. Alternatively, the drive stage 201 can be implemented as described herein, using a number of strings having a drain and/or gate line that has a varying inductance from input to output (such as shown in FIG. 8). In any such case, the drive stage 201 receives an input signal and prepares that signal to be received and processed at the power stage 202. In one example case, the drive stage 201 divides the input signal into two signals, amplifies and/or filters the resulting signals, and provides impedance matching and/or any other desired processing as will be appreciated in light of this disclosure.

The power stage 202 includes two strings, 204A and 204B, each including six transistor cells. In this example case, the drain traces 206A and 206B are each a stepped structure that steps the impedance from the first transistor 212A to the last transistor 212B, such that the associated inductance successively decreases from input 210 to output 208. Strings 204A and 204B can have their outputs combined with a connection junction as previously explained with respect to FIG. 8 (e.g., trace 192), and such a connection junction may be configured to perform an impedance matching function (for proper coupling to the next stage) as well as allow for injection of a drain bias. Note that, in some example embodiments, some such impedance matching and/or the bias injection functionality can be integrated into the drain traces 206A and 206B.

In one specific example case, the non-shared drain high power amplifier 200 may use a 12 mm total-gate-periphery power stage 202 with a 4.8 mm total-gate-periphery driver stage 201. The 2.5:1 drive ratio was used in this example design to provide sufficient drive power to the second-stage of the non-shared drain amplifier 200 and to maintain the desired level of drive compression. In one specific chip implementation of this embodiment, the architecture utilized six 800 um cell devices in the first stage 201 and twelve 1.2 mm cell devices in the second stage 202. The resulting chip size is approximately 6.831 mm×4.958 mm, although numerous configurations are possible.

Figure 10:
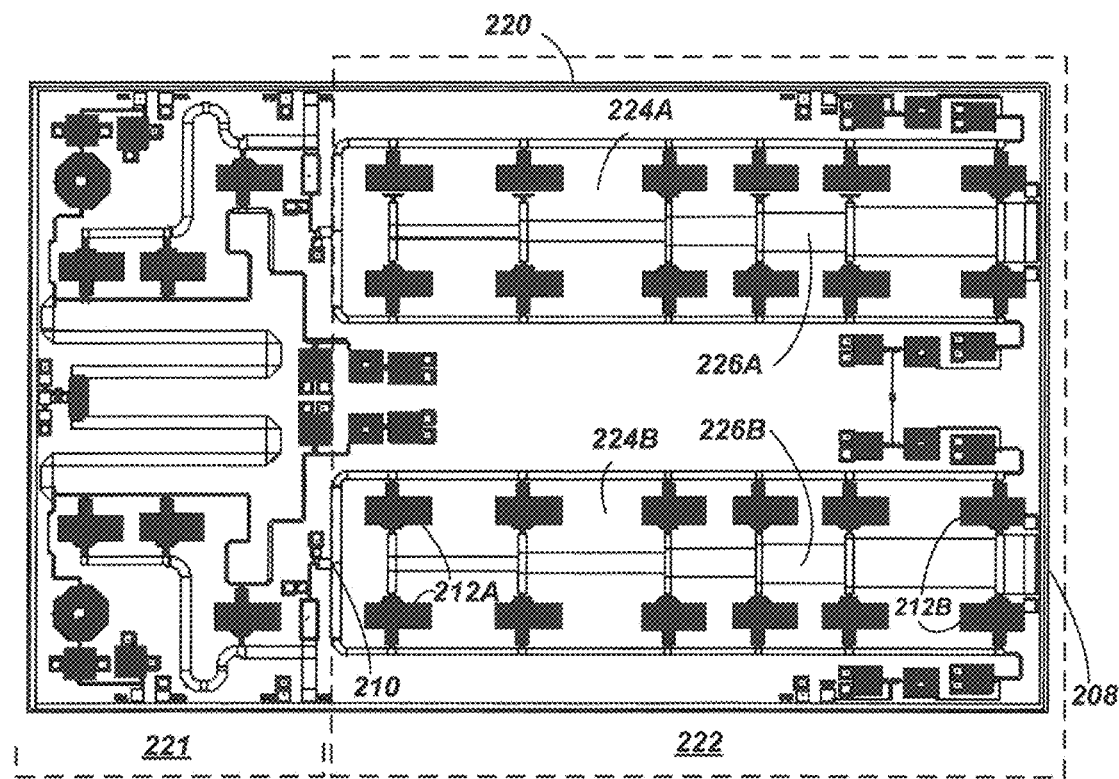
FIG. 10 is a top view of the topology for a high power amplifier configured in accordance with another embodiment of the present invention.

FIG. 10 is a top view of the topology for a high power amplifier 220 configured in accordance with another embodiment of the present invention. This specific example embodiment demonstrates a 19.2 mm total-gate-periphery high power amplifier 220 MMIC that uses an NDPA circuit architecture. The amplifier 220 includes a driver stage 221 and a power stage 222, which is configured with a shared drain topology where each pair of strings share a drain line.

The drive stage 221 can be implemented as discussed with reference to driver stage 201, and that relevant description is equally applicable here. The output of the drive stage 221 is provided to the inputs of the non-uniform distributed amplifier strings at the power stage 222.

The power stage 222 in this example configuration includes two string pairs, generally designated at 224A and 224B, respectively. Each string includes six transistors in this example. As can be further seen, the shared drain traces 226A and 226B are each a stepped structure that steps the impedance from the first transistors 212A of the string pair to the last transistors 212B of the string pair, such that the associated inductance successively decreases from input 210 to output 208. The shared drain 226A effectively combines the output of the strings comprising string pair 224A, and shared drain 226B effectively combines the output of strings comprising string pair 224B. In addition, the outputs of each string pairs (224A and 224B) can be combined with a three-way connection junction as previously explained with respect to FIG. 8 (e.g., trace 192), and such connection junction may be configured to perform an impedance matching function (for proper coupling to the next stage) as well as allow for injection of a drain bias, as previously explained. As will be appreciated in light of this disclosure, note that the shared drain traces 226A/226B function to combine the outputs of their respective string pairs, but can also have other functionality integrated therein, such as for injecting a drain bias and/or impedance matching.

The strings illustrated in the example embodiments shown in FIGS. 8, 9, and 10 predominantly exhibit a real-impedance at the input and output terminals over several octaves of frequency bandwidth, thereby enabling lowpass and bandpass impedance transforming networks to combine several strings into a wideband high-power amplifier MMIC of a prescribed output power. The example string variant demonstrated in FIG. 10 (which employs a shared drain topology) provides a significantly more distributed active device topology, which in turn provides for lower operating temperature and improved performance. Numerous power amplifier architectures and layouts can be implemented using the techniques provided herein, and the degree of combining will depend, for example, on factors such as the given application and desired output power.

Figure 11:
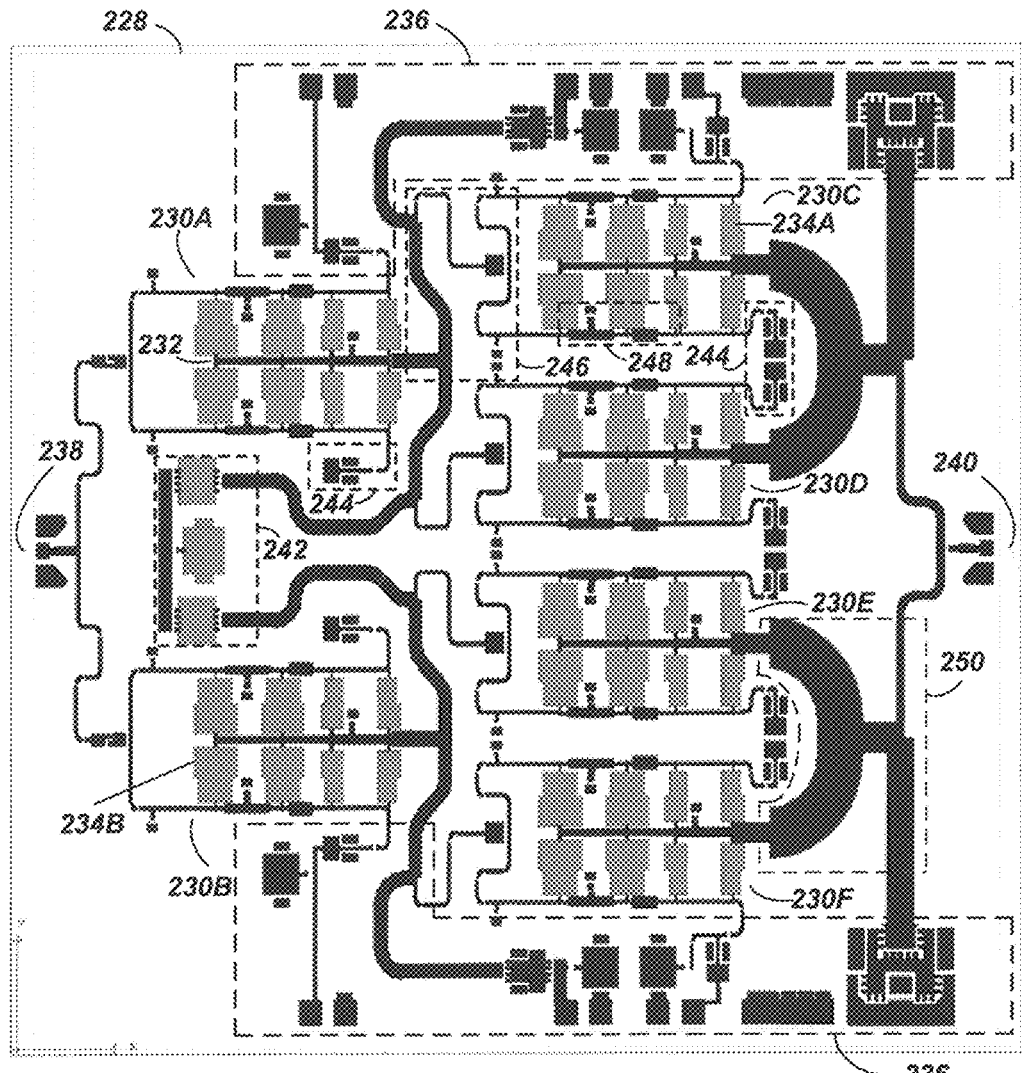
FIG. 11 is a top view of the topology for a high power amplifier configured in accordance with another embodiment of the present invention.

FIG. 11 illustrates another example layout of the more highly distributed variant of NDPA strings in a power amplifier 228, configured in accordance with an embodiment of the present invention. As can be seen in this specific example embodiment, a total of six string pairs 230A, 230B, 230C, 230D, 230E, and 230F are utilized. String pairs 230A and 230B are included in the first stage of the amplifier 228, and string pairs 230C, 230D, 230E, and 230F are included in the second stage of the amplifier 228. Each string pair is configured similarly (and therefore description of one equally applies to the others), and includes a shared drain trace 232 and a total of eight transistor cells (four cells per string). In this example, there are two types of transistors cells, smaller cells 234A and larger cells 234B. In general, each cell can be configured similarly or differently with respect to other cells, with regard to cell size and componentry.

Figure 12:
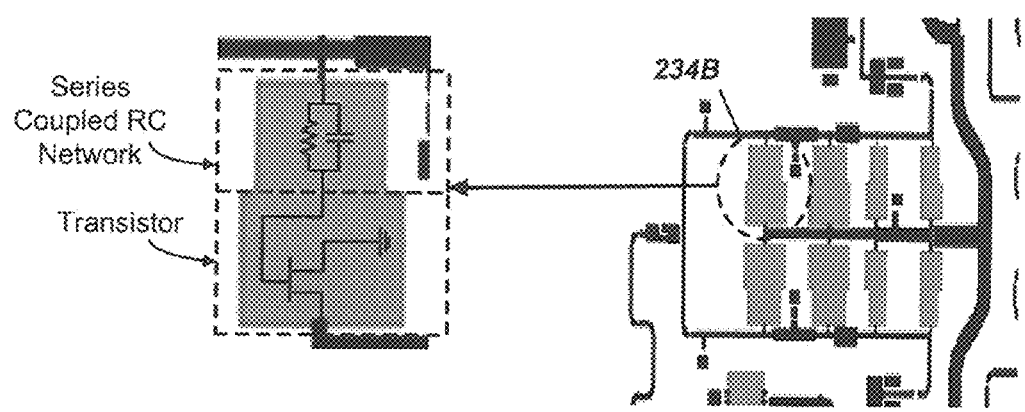
FIG. 12 illustrates an example cell configuration, in accordance with one example embodiment.

In more detail, an individual transistor cell of an NDPA string configured in accordance with an embodiment of the present invention may comprise, for example, a transistor or a transistor with a series-coupled resistor-capacitor (RC) network on the gate electrode of the transistor. In some such embodiments, the cells are identical in device total-gate-periphery (footprint size), while in other embodiments non-identical cells can be utilized. The cells can have, for example, different size transistors, or a different series-coupled RC network on the gate electrode of the transistor, or different size transistors with different series-coupled RC networks. Cells may also have different transistor types (e.g., FETs and bipolar junction transistors, or FETS and heterojunction bipolar transistors). In some cases, the use of non-identical cells facilitates the physical realization of the required transmission-line segments between individual transistors. For instance, in some embodiments, there may be a trade (in the design of a given NDPA string) between the transmission line trace width between transistors of a string and the capacity of those transmission lines to carry the prescribed value of DC current, while maintaining the impedance required of that transmission line. In such cases, a different size cell and/or gate series coupled RC network can be used to provide an additional degree of freedom into the design that enables the NDPA string to be realized. Varying the gate series coupled RC network and/or the transistor size also allows tuning of the power and gain response versus frequency, including the level of gain ripple. In some embodiments having multiple cell sizes, the larger cell size can be an integer multiple of the smallest cell size (e.g., 2×, 3×, etc), since such integral sizing simplifies the inter-segment transmission line impedance designs. Note, however, that such an integral cell sizing scheme is not required. FIG. 12 illustrates an example cell configuration, in accordance with one example embodiment. As can be seen, the cell includes a transistor and a series-coupled RC network, which can be fabricated using conventional processing techniques, such as those used, for example, in GaAs, InP, and GaN CMOS, or other such suitable process technologies. This example cell structure corresponds to larger cell 234B shown in FIG. 11, and configuration for smaller cells can be implemented in a similar manner (without or without the gate series coupled RC network). As previously explained, not all cells need to be configured the same, or with the same transistors and/or gate series coupled RC network (i.e., multiple types of transistors and/or gate series coupled RC networks can be used in any one string).

Other features and componentry of amplifier 228 will be apparent in light of this disclosure. For instance, the amplifier 228 further includes an RF input 238 and an RF output 240 and bias input/output (I/O) circuitry 236 (to allow for injection of bias), each of which can be implemented as conventionally done. In addition, shunt by-pass capacitors 242 can be provided on the drain bias line for isolating common nodes of the amplifier circuit. Each gate line termination 244 can be implemented, for example, with a series inductor, resistor, and capacitor-to-ground for DC-current blocking. Inter-stage DC de-coupling 246 is configured with impedance matching (e.g., by setting trace shape to provide desired inductance) and a capacitor to isolate the first and second stage biases. Likewise, gate line inductors 248 can be realized with transmission lines (e.g., microstrip) with or without capacitive-loading. In one specific example embodiment, the gate lines are tapered or otherwise shaped to provide an inductance that increases from the string input to the string output, although other embodiments may have a gate line inductance that rises and falls at different points in the gate line (rather than solely ascending or descending inductance), as will be appreciated in light of this disclosure (e.g., depending on spacing and size of transistors within string). Each output combiner 250 in this example embodiment is configured with impedance matching (inductance) and a drain bias connection.

In operation, an RF input signal at 238 is first equally divided, with one half of the signal provided to the gate line (input) of string pair 230A and the other half signal provided to the gate line of string pair 230B. Each of string pairs 230A and 230B are biased to provide a desired gain factor and amplify their respective input signals accordingly. The output signal at the shared drain 232 of string pair 230A is equally divided, with one half of the signal coupled to the gate line of string pair 230C and the other half signal coupled to the gate line of string pair 230D. In a similar fashion, the output signal at the shared drain 232 of string pair 2308 is equally divided, with one half of the signal coupled to the gate line of string pair 230E and the other half signal coupled to the gate line of string pair 230F. Each of string pairs 230C, 230D, 230E, and 230F are biased to provide a desired gain factor and amplify their respective input signals accordingly. The output signals of string pairs 230C and 230D are combined, as are the output signals of string pairs 230E and 230F. These two resulting combined signals are then themselves combined and provided to the RF output at 240. Impedance matching and biasing can be provided as necessary, given the particulars of a given application.

A number of advantages are associated with the example configuration shown in FIG. 11. For example, an additional degree of combining is provided, in that each shared drain line 232 of the second stage combines the two outputs of a string pair to provide signals in a first power range (e.g., lowest power range), and each of the string pair outputs is combined with another string pair output to provide signals in a second power range (e.g., middle power range), and the two resulting combined string pair outputs are combined to provide signals in a third power range (highest power range). In addition, such architecture effectively increases the periphery of the transistors in the output stage (or second stage in this example case). In general, the larger the periphery of the transistors in the output stage, the higher the output power capability of the die. Additionally, the architecture provides a significant improvement for the thermal management of an individual die, relevant to conventional designs (such as those that couple and combine stage outputs in a less efficient manner and/or fail to use shared gate and/or drain structures with integral impedance matching). The transistors, which are effectively heat sources on the die, can be more distributed on the die leading to a lower proximity heating between adjacent transistors. As such, the transistors can operate at lower junction temperatures, which in turn results in improved RF power (e.g., higher junction temperature of transistor typically results in a derating of the transistor's output power capability). As will further be appreciated in light of this disclosure, the amplifier architecture can also be configured to simplify impedance matching requirements associated with the NDPA strings, due to a tradeoff in required inductance versus required current handling of the traces within the NDPA strings. In addition, there is a frequency performance advantage of the architecture, given the ability to combine more transistor cells with less line length, which results in a lower parasitic design that provides higher frequency performance.

Specific embodiments can be implemented, for example, using conventional 111-V compound process technology to fabricate gallium arsenide (GaAs) transistors or Gallium Nitride (GaN) transistors on a heterogeneous or non-heterogeneous substrate, so as to provide a compact power amplifier MMIC. Note, however, that any number of process technologies and transistor and substrate materials can be used to implement the claimed invention, as will be appreciated in light of this disclosure. One specific embodiment of a power amplifier device configured in accordance with an embodiment of the present invention, such as those examples illustrated in FIG. 8-11, is one that has a nominal power gain of greater than 45 dB, a nominal output power of greater than about 50 W, and a frequency bandwidth performance range from 1-8 GHz.

The foregoing description of the embodiments of the invention has been presented for the purposes of illustration and description. It is not intended to be exhaustive or to limit the invention to the precise form disclosed. Many modifications and variations are possible in light of this disclosure. Note that use of the term equal or equals herein is not intended to require precise equality; rather, the impedances (e.g., inductances and capacitances) are equal within an acceptable tolerance (e.g., within +/−10% of each other, or better). Similarly, reference to divided, or other such references are not intended to implicate precise division, etc; rather, the resulting amount can be within a given tolerance of the target amount (e.g., +/−10 or better) that is acceptable for the application at hand. It is intended that the scope of the invention be limited not by this detailed description, but rather by the claims appended hereto.

What is claimed is:

1. A method of forming a power amplifier, the method comprising:
   constructing one or more strings of amplification stages on a substrate, wherein constructing each string of the one or more strings includes:
      constructing a plurality of amplification stages, wherein constructing each amplification stage of the plurality of amplification stages comprises:
         constructing a semiconductor device on the substrate;
         placing an inductor at a drain of the semiconductor device; and
         placing an inductor at a gate of the semiconductor device; and
      coupling the plurality of amplification stages together serially to form the string;
   wherein the inductor at the drain of the semiconductor device of each stage in the string has an inductance that is decreased compared to the inductor at the drain of the semiconductor device of a previous amplification stage in the string; and
   wherein the inductor at the gate of the semiconductor device of each stage in the string has an inductance that is increased compared to the inductor at the gate of the semiconductor device of a previous amplification stage in the string.

2. The method of claim 1, wherein said constructing one or more strings of amplification stages comprises constructing a first string of amplification stages and a second string of amplification stages.

3. The method of claim 2, further comprising combining the output signals of the first string and the second string to form a common output signal.

4. The method of claim 2, further comprising dividing a common input signal to form the input signals of the first string and the second string.

5. The method of claim 1, wherein said constructing one or more strings of amplification stages comprises constructing a first string of amplification stages and a second string of amplification stages, and further comprising combining the output signals of the first string and the second string to form a first output.

6. The method of claim 1, wherein said constructing one or more strings of amplification stages further comprises constructing a third string of amplification stages and a fourth string of amplification stages, and further comprising:
   combining the output signals of the third string and the fourth string to form a second output; and
   combining the first and second outputs.

7. The method of claim 1, wherein the semiconductor device is a field-effect transistor.

8. The method of claim 1, wherein the power amplifier is an integrated circuit chip.

9. The method of claim 1, wherein said constructing each string of amplification stages further comprises configuring the amplification stages such that the voltage input to one amplification stage in a string is within 5% of the voltage input to other amplification stages in the string.

10. The method of claim 1, wherein said constructing each string of amplification stages further comprises configuring the string of amplification stages such that the input and output impedances of the string have substantially real components.

11. A method of forming a power amplifier, the method comprising:
constructing one or more strings of amplification stages on a substrate, wherein constructing each string of the one or more strings includes:
constructing a plurality of amplification stages, wherein constructing each amplification stage of the plurality of amplification stages comprises:
constructing a semiconductor device on the substrate;
placing a plurality of inductors at a drain of the semiconductor device, wherein the plurality of inductors form a drain inductance;
placing a transmission line segment at the drain of the semiconductor device;
placing a plurality of inductors at a gate of the semiconductor device, wherein the plurality of inductors form a gate inductance; and
placing a transmission line segment at the gate of the semiconductor device; and
coupling the plurality of amplification stages together serially to form the string;
wherein the drain inductance of each stage in the string is decreased compared to the drain inductance of a previous amplification stage in the string; and
wherein the gate inductance of each amplification stage in the string is increased compared to the gate inductance of a previous amplification stage in the string.

12. The method of claim 11, wherein said constructing each string further comprises placing one or more capacitors at one or more of the gates of the semiconductor devices to lower the effective characteristic impedance of each amplification stage.

13. The method of claim 11, wherein, for each amplification stage, the transmission line at the drain of the semiconductor device and the transmission line at the gate of the semiconductor device are selected so that a phase delay at the drain matches a phase delay at the gate.

14. The method of claim 11, wherein, for one or more of the amplification stages, the inductors at the drain of the semiconductor device straddle the transmission line at the drain of the semiconductor device.

15. The method of claim 11, wherein said constructing each string of amplification stages further comprises configuring the amplification stages such that the voltage input to one amplification stage in a string is within 5% of the voltage input to other amplification stages in the string.

16. The method of claim 11, wherein said constructing each string of amplification stages further comprises configuring the string of amplification stages such that the input and output impedances of the string have substantially real components.

17. The method of claim 11, wherein said constructing one or more strings of amplification stages comprises constructing a first string of amplification stages, a second string of amplification stages, a third string of amplification stages, and a fourth string of amplification stages, and further comprising:
combining the output signals of the first string and the second string to form a first intermediate output;
combining the output signals of the third string and the fourth string to form a second intermediate output; and
combining the first and second intermediate outputs.

18. A method of forming a power amplifier, the method comprising:
forming a string of successive amplification stages between a power amplifier input and a power amplifier output;
forming a drain inductor for each successive amplification stage from the string, wherein the drain inductor is coupled to a transistor drain of the respective amplification stage and has an inductance that is decreased compared to the drain inductor of a previous amplification stage; and
forming a gate inductor for each successive amplification stage from the string, wherein the gate inductor is coupled to a transistor gate of the respective amplification stage and has an inductance that is increased compared to the gate inductor of a previous amplification stage.

19. The method of claim 18, further comprising:
forming another string of successive amplification stages between the power amplifier input and the power amplifier output;
forming a drain inductor for each successive amplification stage from the another string, wherein the drain inductor is coupled to a transistor drain of the respective amplification stage and has an inductance that is decreased compared to the drain inductor of a previous amplification stage;
forming a gate inductor for each successive amplification stages from the another string, wherein the drain inductor is coupled to a transistor gate of the respective amplification stage and has an inductance that is increased compared to the gate inductor of a previous amplification stage; and
combining an output signal of the string and another output signal of the another string to form a common output signal.

20. The method of claim 18, further comprising forming a capacitor for each successive amplification stage of the string, wherein each capacitor is formed at the transistor gate of the respective amplification stage to lower the effective characteristic impedance of the respective amplification stage.

* * * * *

UNITED STATES PATENT AND TRADEMARK OFFICE
CERTIFICATE OF CORRECTION

PATENT NO. : 8,576,009 B2
APPLICATION NO. : 13/316900
DATED : November 5, 2013
INVENTOR(S) : Lender, Jr. et al.

It is certified that error appears in the above-identified patent and that said Letters Patent is hereby corrected as shown below:

In the Specification

In Column 1, Line 5, delete "Ser. No. 13/081,279" and insert -- U.S. Application Ser. No. 13/081,279, --, therefor.

In Column 1, Line 6, delete "Apr. 6, 2011 which was" and insert -- Apr. 6, 2011, which is --, therefor.

In Column 1, Line 9, delete "Jan. 28, 2010. This application is" and insert -- Jan. 28, 2010 and is --, therefor.

In Column 16, Line 64, delete "2308" and insert -- 230B --, therefor.

In Column 17, Line 45, delete "111-V" and insert -- III-V --, therefor.

In the Claims

In Column 18, Line 50, in Claim 6, delete "claim 1," and insert -- claim 5, --, therefor.

Signed and Sealed this
Sixth Day of May, 2014

Michelle K. Lee
*Deputy Director of the United States Patent and Trademark Office*